United States Patent
Hirano et al.

(10) Patent No.: US 11,664,240 B2
(45) Date of Patent: May 30, 2023

(54) METHOD FOR PRODUCING LAMINATE HAVING PATTERNED METAL FOIL, AND LAMINATE HAVING PATTERNED METAL FOIL

(71) Applicant: MITSUBISHI GAS CHEMICAL COMPANY, INC., Tokyo (JP)

(72) Inventors: Syunsuke Hirano, Yamagata (JP); Yoshihiro Kato, Yamagata (JP); Takaaki Ogashiwa, Yamagata (JP); Kazuaki Kawashita, Yamagata (JP); Makoto Murakami, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 381 days.

(21) Appl. No.: 16/763,796

(22) PCT Filed: Nov. 1, 2018

(86) PCT No.: PCT/JP2018/040688
§ 371 (c)(1),
(2) Date: May 13, 2020

(87) PCT Pub. No.: WO2019/098043
PCT Pub. Date: May 23, 2019

(65) Prior Publication Data
US 2020/0388506 A1  Dec. 10, 2020

(30) Foreign Application Priority Data

Nov. 16, 2017  (JP) .............................. JP2017-220778

(51) Int. Cl.
*H05K 1/02* (2006.01)
*H05K 1/09* (2006.01)
*H05K 1/11* (2006.01)
*H05K 3/02* (2006.01)
*H05K 3/22* (2006.01)
(Continued)

(52) U.S. Cl.
CPC .... *H01L 21/4857* (2013.01); *H01L 23/49822* (2013.01); *H01L 23/49838* (2013.01);
(Continued)

(58) Field of Classification Search
CPC ... H05K 1/02; H05K 1/09; H05K 1/11; H05K 1/185; H05K 1/0271; H05K 3/02;
(Continued)

(56) References Cited

U.S. PATENT DOCUMENTS

2004/0067349 A1   4/2004  Okamura et al.
2010/0044081 A1*  2/2010  Morimoto ............... B32B 27/12
                                                     174/251
(Continued)

FOREIGN PATENT DOCUMENTS

JP    S59-500341 A    3/1984
JP    2003-46247 A    2/2003
(Continued)

OTHER PUBLICATIONS

ISR issued in WIPO Patent Application No. PCT/JP2018/040688, dated Jan. 29, 2019, English translation.
(Continued)

*Primary Examiner* — Xiaoliang Chen
(74) *Attorney, Agent, or Firm* — Greenblum & Bernstein, P.L.C.

(57) ABSTRACT

The method for producing a laminate having a patterned metal foil includes masking the whole surface of a first metal foil in a laminate having the first metal foil, a first insulating resin layer having a thickness of 1 to 200 μm and a second metal foil laminated in this order, and patterning the second metal foil.

11 Claims, 2 Drawing Sheets

(51) Int. Cl.
  *H05K 3/38*    (2006.01)
  *H01L 21/48*   (2006.01)
  *H01L 21/50*   (2006.01)
  *H01L 21/78*   (2006.01)
  *H01L 23/00*   (2006.01)
  *H01L 23/495*  (2006.01)
  *H01L 23/538*  (2006.01)
  *H01L 23/498*  (2006.01)
  *H05K 3/00*    (2006.01)
  *H05K 3/46*    (2006.01)

(52) U.S. Cl.
  CPC .............. *H05K 3/0038* (2013.01); *H05K 3/02* (2013.01); *H05K 3/4658* (2013.01); *H05K 3/0076* (2013.01)

(58) Field of Classification Search
  CPC .... H05K 3/022; H05K 3/0038; H05K 3/0076; H05K 3/0097; H05K 3/421; H05K 3/4658; H05K 3/4682; H01L 21/48; H01L 21/50; H01L 21/78; H01L 21/486; H01L 21/4857; H01L 23/00; H01L 23/495; H01L 23/538; H01L 23/562; H01L 23/49822; H01L 23/49838
  USPC ......... 430/311; 174/251, 262; 257/666, 734, 257/774; 29/622, 846
  See application file for complete search history.

(56) References Cited

U.S. PATENT DOCUMENTS

| | | | | |
|---|---|---|---|---|
| 2010/0307898 | A1* | 12/2010 | Liu ................... | H01H 13/83 200/314 |
| 2012/0013021 | A1* | 1/2012 | Kobayashi ............ | H01L 24/19 257/E21.597 |
| 2012/0018860 | A1* | 1/2012 | Maniwa ............ | H01L 23/49861 216/14 |
| 2012/0061809 | A1* | 3/2012 | Toda ................... | H01L 23/4951 216/14 |
| 2013/0249075 | A1* | 9/2013 | Tateiwa ................ | H01L 23/562 257/734 |
| 2016/0113120 | A1* | 4/2016 | Ishihara .............. | H05K 3/4682 174/262 |
| 2016/0309582 | A1* | 10/2016 | Tomizawa ........... | H05K 3/4644 |

FOREIGN PATENT DOCUMENTS

| | | |
|---|---|---|
| JP | 2017-147362 A | 8/2017 |
| WO | 83/03065 A | 9/1983 |

OTHER PUBLICATIONS

IPRP issued in WIPO Patent Application No. PCT/JP2018/040688, dated May 19, 2020, English translation.

* cited by examiner

METHOD FOR PRODUCING LAMINATE HAVING PATTERNED METAL FOIL, AND LAMINATE HAVING PATTERNED METAL FOIL

TECHNICAL FIELD

The present invention relates to a method for producing a laminate having a patterned metal foil, and a laminate having a patterned metal foil.

BACKGROUND ART

Function enhancement and downsizing of semiconductor packages broadly used in electronic apparatuses, communication apparatuses, personal computers and the like have recently been increasingly accelerated. Along therewith, thickness reduction of printed wiring boards and substrates for loading semiconductor devices in the semiconductor packages has been demanded. The printed wiring boards and the substrates for loading semiconductor devices are usually fabricated by laminating a layer (circuit pattern layer) to become a circuit pattern and an insulating material (insulating resin layer) on a support substrate.

For example, Patent Document 1 discloses a method for producing a thin printed wiring board in which: a circuit pattern is formed, by pattern plating, on a laminate in which a copper layer peelable in a later step is formed on a high-rigidity thick support substrate (carrier substrate) such as a stainless steel one; an insulating layer like an epoxy resin-coated fiber glass is laminated thereon and subjected to heating and pressurizing treatment; and finally the support substrate is peeled and removed to thereby produce the thin printed wiring board. By thus laminating a circuit pattern and an insulating material on a high-rigidity thick support substrate and finally peeling and removing the support substrate, a thin printed wiring board and a thin substrate for loading semiconductor devices can be produced even using an existing production apparatus.

CITATION LIST

Patent Document
Patent Document 1: National Publication of International Patent Application No. 1984-500341

SUMMARY OF INVENTION

Technical Problem

However, when with the aim of thickness reduction, printed wiring boards and substrates for loading semiconductor devices are intended to be produced without using support substrates, if existing production apparatuses are used, for example the following problems arise: the printed wiring boards and the substrates for loading semiconductor devices are broken; and the printed wiring boards and the substrates for loading semiconductor devices are wound around conveyers. Hence, it is difficult to produce printed wiring boards and substrates for loading semiconductor devices, with the aim of thickness reduction, by using existing production apparatuses.

The production, utilizing a method described in Patent Document 1, of the thin printed wiring board and the thin substrate for loading semiconductor devices, since used support substrates must be scrapped, poses a problem from the recent demand for reduction in the amount of material wastes (viewpoint of the environmental load reduction).

Further, since the production method described in Patent Document 1 must first produce a laminate in which a copper layer, an insulating layer and a copper layer are laminated in this order on each of both surfaces of a high-rigidity thick support substrate, and no any production process which cannot produce this laminate is allowed, the production method is poor in versatility to production process. Further, in order to fabricate a circuit pattern from this laminate, the insulating layer needs to be made thick; and the case of producing a thickness-reduced printed wiring board and a thickness-reduced substrate for loading semiconductor devices poses, for example, the following problems: the copper layers and the layer of the insulating material in a laminate are peeled from each other; and the printed wiring board and the substrate for loading semiconductor devices are broken.

The present invention has been made in consideration of such problems, and an object thereof is to provide a method for producing a laminate having a patterned metal foil wherein the production method enables reduction in the amount of material wastes because not producing a laminate by using a support substrate, is highly versatile to production processes because a step of producing a laminate containing a support substrate and a step of peeling and removing the support substrate can be eliminated, and further can produce a laminate having a patterned metal foil which can suitably be used for a thickness-reduced printed wiring board and a thickness-reduced substrate for loading semiconductor devices.

An object of the present invention further is to provide a laminate having a patterned metal foil which can suitably be used for a thickness-reduced printed wiring board and a thickness-reduced substrate for loading semiconductor devices.

Solution to Problem

As a result of exhaustive studies to solve the above problems, the present inventors have found that in a laminate in which a metal foil is laminated on each of both surfaces of a thin insulating resin layer, when a production method comprising a step of masking the metal foil on one surface and patterning only the metal foil on the other surface is used, the laminate, since having a high-rigidity metal foil on one surface thereof, can be processed without the thin insulating resin layer being broken, and this finding has led to the completion of the present invention.

That is, the present invention is as follows.

[1]
A method for producing a laminate having a patterned metal foil, comprising: a step of masking a whole surface of a first metal foil in a laminate having the first metal foil, a first insulating resin layer having a thickness of 1 to 200 μm and a second metal foil laminated in this order; and a step of patterning the second metal foil.

[2]
The method according to [1], wherein a thickness of the first metal foil is 1 to 100 μm.

[3]
The method according to [1] or [2], wherein the masking step is a step of laminating a resist on the whole surface of the first metal foil for masking.

[4]
A method for producing a laminate having a patterned metal foil, comprising: a step of laminating a second insulating resin layer on the first insulating resin layer having the second metal foil laminated thereon so that the second metal foil in the laminate having the patterned metal foil according to any of [1] to [3] is covered with the second insulating resin layer; and a step of laminating a third metal foil on the second insulating resin layer.

[5]

A method for producing a laminate having a patterned metal foil, comprising: a step of masking a whole surface of the third metal foil in the laminate having the patterned metal foil according to [4]; and a step of patterning the first metal foil.

[6]

The method according to [5], wherein the masking step is a step of laminating a resist on the whole surface of the third metal foil for masking.

[7]

A method for producing a laminate having a patterned metal foil, comprising: a step of laminating a third insulating resin layer on the first insulating resin layer having the first metal foil laminated thereon so that the first metal foil in the laminate having the patterned metal foil according to [5] or [6] is covered with the third insulating resin layer; and a step of laminating a fourth metal foil on the third insulating resin layer.

[8]

The method according to [4], further comprising a step of irradiating a predetermined position of a surface of the third metal foil with a laser beam to thereby provide a first via hole starting from the surface of the third metal foil and reaching the second metal foil or the first metal foil on an opposite surface.

[9]

The method according to [8], further comprising a step of subjecting an inside of the first via hole to a desmear treatment.

[10]

The method according to [7], further comprising a step of irradiating a predetermined position of a surface of the third metal foil with a laser beam to thereby provide a second via hole starting from the surface of the third metal foil and reaching any of the second metal foil, the first metal foil or the fourth metal foil on an opposite surface.

[11]

The method according to [7] or [10], further comprising a step of irradiating a predetermined position of a surface of the fourth metal foil with a laser beam to thereby provide a third via hole starting from the surface of the fourth metal foil and reaching any of the first metal foil, the second metal foil or the third metal foil on an opposite surface.

[12]

The method according to [10], further comprising a step of subjecting an inside of the second via hole to a desmear treatment.

[13]

The method according to [11], further comprising a step of subjecting an inside of the third via hole to a desmear treatment.

[14]

A laminate having a patterned metal foil, comprising: a first insulating resin layer having a thickness of 1 to 200 µm; a first metal foil laminated on one surface of the first insulating resin layer; a second metal foil laminated on a surface of the first insulating resin layer opposite to the surface having the first metal foil laminated thereon, and patterned; a second insulating resin layer laminated on the first insulating resin layer having the second metal foil laminated thereon, and covering the second metal foil; and a third metal foil laminated on the second insulating resin layer.

[15]

The laminate according to [14], wherein a thickness of the first metal foil is 1 to 100 µm.

[16]

The laminate according to [14] or [15], further comprising a first via hole starting from a surface of the third metal foil and reaching the second metal foil or the first metal foil on an opposite surface.

[17]

A laminate having a patterned metal foil, comprising: a first insulating resin layer having a thickness of 1 to 200 µm; a first metal foil laminated on one surface of the first insulating resin layer, and patterned; a third insulating resin layer laminated on the first insulating resin layer having the first metal foil laminated thereon, and covering the first metal foil; a fourth metal foil laminated on the third insulating resin layer; a second metal foil laminated on a surface of the first insulating resin layer opposite to the surface having the first metal foil laminated thereon, and patterned; a second insulating resin layer laminated on the first insulating resin layer having the second metal foil laminated thereon, and covering the second metal foil; and a third metal foil laminated on the second insulating resin layer.

[18]

The laminate according to [17], wherein a thickness of the first metal foil is 1 to 100 µm.

[19]

The laminate according to [17] or [18], further comprising a second via hole starting from a surface of the third metal foil and reaching any of the second metal foil, the first metal foil or the fourth metal foil on an opposite surface.

[20]

The laminate according to any of [17] to [19], further comprising a third via hole starting from a surface of the fourth metal foil and reaching any of the first metal foil, the second metal foil or the third metal foil on an opposite surface.

Advantageous Effects of Invention

According to the present invention, since a laminate is not produced by using a support substrate, reduction in the amount of material wastes is enabled. Further, since a step of producing a laminate containing a support substrate and a step of peeling and removing the support substrate can be eliminated, the present invention can be applied to existing production processes, thus having high versatility. Further, according to the present invention, a method for producing a laminate which can suitably be used for a thickness-reduced printed wiring board and a thickness-reduced substrate for loading semiconductor devices can be provided.

According to the present invention, a laminate which can suitably be used for a thickness-reduced printed wiring board and a thickness-reduced substrate for loading semiconductor devices can be provided.

DESCRIPTION OF EMBODIMENTS

Figure 1:
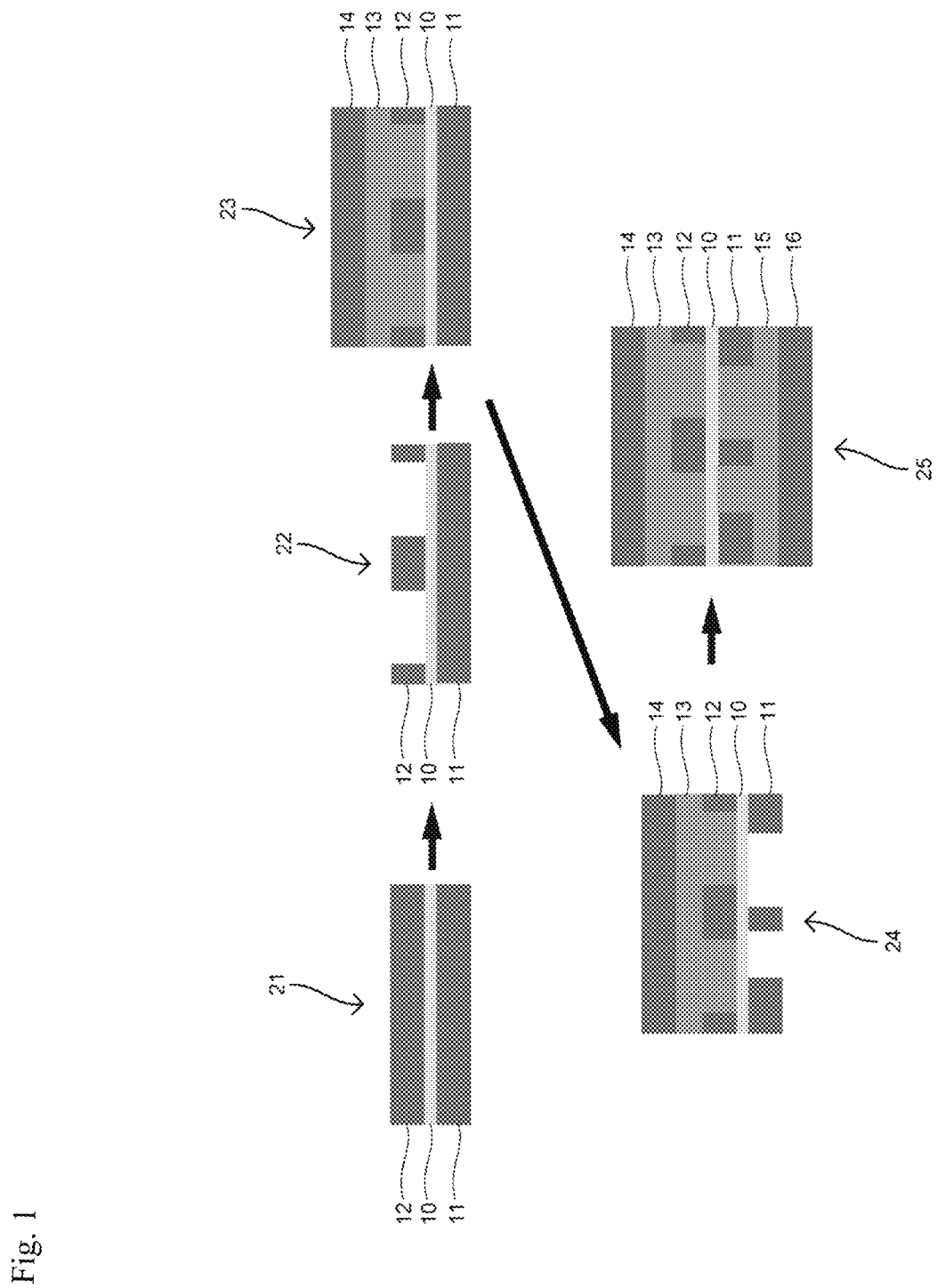
FIG. 1 shows a schematic view illustrating a method for producing a laminate having a patterned metal foil(s) in the present embodiments.

Hereinafter, embodiments (hereinafter, referred to simply as "present embodiments") to carry out the present invention will be described, as required, by reference to the drawings, but the present invention is not any more limited to the following present embodiments. The present invention is allowed to be variously changed and modified without departing from its gist. In the drawings, the same reference sign is attached to the same element and duplicated description will be omitted. The positional relationship of top, bottom, right, left or the like is based on that indicated in the drawings unless otherwise specified. Further, the dimensional ratios in the drawings are not limited to those illustrated in the drawings. In the present description, the laminate is one in which layers are adhered to each other, but as required, the layers may be ones peelable from each other.

A laminate having a patterned metal foil according to a first embodiment, a laminate having a patterned metal foil according to a second embodiment, and methods for producing these laminates will be described based on FIG. 1. In the present embodiments, the "laminate having a patterned metal foil" refers to, at least, a laminate having a patterned metal foil (having a circuit pattern) on one surface or each of both surfaces of a first insulating resin layer.

[The Laminate Having a Patterned Metal Foil and the Method for Producing the Same According to the First Embodiment]

The laminate 23 having a patterned metal foil according to the first embodiment contains a first insulating resin layer 10 having a thickness of 1 to 200 μm; a first metal foil 11 laminated on one surface of the first insulating resin layer 10; a second metal foil 12 laminated and patterned on a surface of the first insulating resin layer 10 opposite to the surface having the first metal foil 11 laminated thereon; a second insulating resin layer 13 laminated on the first insulating resin layer 10 having the second metal foil 12 laminated thereon and covering the second metal foil 12; and a third metal foil 14 laminated on the second insulating resin layer 13.

Then, the method for producing the laminate 23 having a patterned metal foil according to the first embodiment contains a step of masking a whole surface of the first metal foil 11 in the laminate 21 in which the first metal foil 11, the first insulating resin layer 10 having a thickness of 1 to 200 μm and the second metal foil 12 are laminated in this order; a step of patterning the second metal foil 12, a step of laminating the second insulating resin layer 13 on the first insulating resin layer 10 having the second metal foil 12 thereon so that the second metal foil 12 is covered with the second insulating resin layer 13; and a step of laminating the third metal foil 14 on the second insulating resin layer 13.

The method for producing the laminate 23 having a patterned metal foil according to the first embodiment, by containing the step of using the laminate 21 in which the first metal foil 11 and the second metal foil 12 are laminated on both surfaces of the thin first insulating resin layer 10, masking the whole surface of the first metal foil 11 in the laminate 21 and patterning only the second metal foil 12 on the other surface, can pattern the second metal foil 12 while having the high-rigidity first metal foil 11 on one surface. Hence, the laminate 23 can suitably be produced without the thin insulating resin layer 10 being destroyed.

Further, according to the method for producing the laminate 23 having a patterned metal foil according to the first embodiment, the laminate 23 can be produced by using the thin first insulating resin layer 10 without using a high-rigidity thick support substrate (carrier substrate). Hence, the amount of material wastes is enabled to be greatly reduced, and since a step of producing a laminate containing a support substrate and a step of peeling and removing the support substrate can be eliminated, the production method is high in versatility to production processes.

The laminate 23 having a patterned metal foil according to the first embodiment, since having the thin first insulating resin layer 10, can suitably be used for a printed wiring board and a substrate for loading semiconductor devices with the aim of their thickness reduction.

The first insulating resin layer 10 is not especially limited, and usually contains a thermosetting resin and an inorganic filler, and as required, a glass cloth. The thickness of the first insulating resin layer 10 is usually 1 to 200 μm, and from the viewpoint of ease of handleability of the laminate, preferably 1 to 100 μm and more preferably 1 to 40 μm. In the present embodiment, by using the production method containing the step of masking a metal foil on one surface and patterning only a metal foil on the other surface, even when the thickness of the first insulating resin layer 10 is made thin, for example the following problems do not arise: the printed wiring board and the substrate for loading semiconductor devices are broken; and the printed wiring board and the substrate for loading semiconductor devices are wound around a conveyer.

The thermosetting resin is not especially limited as long as being a thermosetting resin to be used for printed wiring board materials. Specific examples thereof include compounds such as cyanate compounds, epoxy resins, maleimide compounds, polyimide resins and double bond addition polyphenylene ether resins. These can suitably be selected according to objective applications and performance, and can be used singly or in combinations of two or more. Preferable thermosetting resins include cyanate compounds, epoxy resins and maleimide compounds.

The cyanate compound is not especially limited as long as being a compound having two or more cyanate groups in one molecule thereof. Specific examples thereof include bisphenol A-based cyanate compounds, phenol novolac-based cyanate compounds, bisphenol E-based cyanate compounds, naphthalene skeleton-containing cyanate compounds and biphenyl skeleton-containing cyanate compounds. These can suitably be selected according to objective applications and performance, and can be used singly or in combinations of two or more. Preferable cyanate compounds include 2,2-bis(4-cyanatophenyl)propane, bis(3,5-dimethyl-4-cyanatophenyl)methane, phenol novolac-based cyanate compounds and naphtholaralkyl-based cyanate compounds.

The epoxy resin is not especially limited as long as being a compound having two or more epoxy groups in one molecule thereof. Specific examples thereof include bisphenol A-based epoxy resins, bisphenol F-based epoxy resins, biphenol-based epoxy resins, phenol novolac-based epoxy resins, cresol novolac-based epoxy resins, polyfunctional phenol-based epoxy resins, naphthalene skeleton-containing epoxy resins, biphenyl skeleton-containing epoxy resins and phosphorus-containing epoxy resins. These can suitably be selected according to objective applications and performance, and can be used singly or in combinations of two or more. Preferable epoxy resins include bisphenol A-based epoxy resins, phenol novolac-based epoxy resins, biphenylaralkyl-based epoxy resins, naphthalene-based epoxy resins, naphtholaralkyl-based epoxy resins and trifunctional phenol-based epoxy resins.

The maleimide compound is not especially limited as long as being a compound having two or more maleimido groups in one molecule thereof. Specific examples thereof include bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane and polyphenylmethanemaleimide. Here, a maleimide compound can also be blended in a form of a prepolymer of the maleimide compound, a prepolymer of the maleimide compound with an amine compound, or the like. These can suitably be selected according to objective applications and performance, and can be used singly or in combinations of two or more. Preferable maleimide compounds include bis(3-ethyl-5-methyl-4-maleimidophenyl)methane.

As the inorganic filler, metals oxides, nitrides, silicides and borides such as silica, boron nitride, wollastonite, talc, kaolin, clay, mica, alumina, zirconia, titania, barium titanate and magnesium oxide can be used. These can suitably be selected according to objective applications and performance, and can be used singly or in combinations of two or more. The incorporation of the inorganic filler enables the reduction of the thermal expansion coefficient and the improvement of the rigidity in the laminate 23 having a patterned metal foil according to the first embodiment and a laminate 25 having a patterned metal foil according to the second embodiment described later. Particularly by adding an inorganic filler having a low permittivity such as silica, boron nitride or barium titanate, the insulating resin layer according to the present embodiments can be made to have a low permittivity.

The first metal foil 11 and the second metal foil 12 are not especially limited, and examples thereof include gold, silver, copper and aluminum and alloys composed of two or more metals thereof. The metal foil is preferably copper from the viewpoint of electroconductivity. The first metal foil 11 and the second metal foil 12 may be the same or different, and preferably the same. The thicknesses of the first metal foil 11 and the second metal foil 12 are each not especially limited, and are each usually 1 to 18 μm and from the viewpoint of ease of laser drilling, preferably 1 to 15 μm and more preferably 1 to 12 μm. The thicknesses of the metal foils may be identical or different, and is preferably identical.

As the first metal foil 11 and the second metal foil 12, commercially available products, for example, GHY5 (trade name, 12 μm-thick copper foil) manufactured by JX Nippon Mining & Metals Corp., and 3EC-VLP (trade name, 12 μm-thick copper foil) and 3EC-III (trade name, 18 μm-thick copper foil) manufactured by Mitsui Mining & Smelting Co., Ltd can also be used. An adhesive resin layer may further be provided between the first metal foil 11 or the second metal foil 12 and the first insulating resin layer 10 to adhere them, or a metal foil with an adhesive resin layer may be used. The material of the adhesive resin layer is not especially limited, and for example, an acrylic resin, an epoxy resin, a polyimide resin or a polyester resin can be used.

As a laminate 21, a commercially available product, for example, C-2006 (trade name) manufactured by 3M Co. or FaradFlex® manufactured by Mitsui Mining & Smelting Co., Ltd can also be used.

Further, in the first embodiment, a laminate 21 in which a first metal foil 11 and a second metal foil 12 are laminated on both surfaces of a first insulating resin layer 10 can also be obtained by using a resin sheet with a metal foil in which the metal foil and an insulating resin layer are laminated in this order, and laminating a metal foil on the surface of the insulating resin layer of the resin sheet. As the resin sheet with a metal foil, a commercially available product, for example, CRS-381NS1 (trade name, resin sheet with copper foil) manufactured by Mitsubishi Gas Chemical Co., Ltd can also be used.

The thickness of the laminate 21 is not especially limited, and is usually 3 to 236 μm, preferably 4 to 224 μm, more preferably 4 to 136 μm, still more preferably 5 to 124 μm and further still more preferably 5 to 100 μm.

In the first embodiment, a laminate 22 having a patterned metal foil whose second metal foil has been patterned is obtained by masking the whole surface of the first metal foil 11 in the laminate 21, and patterning the second metal foil 12. The masking and the patterning can use well-known masking and patterning carried out in production of printed wiring boards, and are not especially limited, and it is preferable that masking of the whole surface of the first metal foil 11 and patterning (forming a circuit pattern) of the second metal foil 12 are carried out, for example, by a subtractive process.

The masking and patterning by the subtractive process can be carried out, for example, as follows. On the whole surfaces of the first metal foil 11 and the second metal foil 12, a dry film resist (for example, RD-1225 (trade name) manufactured by Hitachi Chemical Co., Ltd.) was laminated at a temperature of 110±10° C. and a pressure of 0.50±0.02 MPa. Then, exposure is carried out on the whole surface of the first metal foil 11 and according to the circuit pattern of the second metal foil 12 for masking. Thereafter, the dry film resist of both the surfaces is subjected to a development treatment with a 1% sodium carbonate aqueous solution, and portions of the second metal foil 12 which are not covered with the etching resist are removed with a cupric chloride aqueous solution; and finally, the dry film resist is stripped in an amine-based resist stripping solution. Thereby, the laminate 22 having a patterned metal foil whose second metal foil 12 has been patterned can be formed.

In the first embodiment, a second insulating resin layer 13 is laminated on the first insulating resin layer 10 so that the patterned second metal foil 12 is covered with the second insulating resin layer 13, and a third metal foil 14 is laminated on the second insulating resin layer 13.

The second insulating resin layer 13 is not especially limited, and for example, the same material or prepreg as for the first insulating resin layer 10 can be used, and it is preferable to use the prepreg from the viewpoint of the thermal expansion and the heat resistance.

The prepreg refers to a material in which a resin composition is added and adhered to a fibrous reinforcing material such as glass fibers or organic fibers. The prepreg is not especially limited, and examples thereof include ones composed of the following resin compositions and fibrous reinforcing materials. Examples of the resin composition include compositions containing one or more resins selected from the group consisting of epoxy resins, cyanate compounds, maleimide compounds, bismaleimide triazine resins, polyimide resins, polyphenylene ether resins, phenol resins, melanine resins, polyurethane resins and polyester resins. These can suitably be selected according to objective applications and performance, and can be used singly or in combinations of two or more. Examples of the fibrous reinforcing material include inorganic fibers composed of glass fibers (for example, E glass, D glass, S glass, NE glass, T glass and Q glass), quartz and the like, organic fibers composed of polyimide, polyamide, polyester and the like, and carbon fibers and cellulose fibers. These can suitably be selected according to objective applications and performance, and can be used singly or in combinations of two or more. Examples of the shape of the fibrous reinforcing material include shapes of woven fabric, nonwoven fabric, roving, chopped strand mat and surfacing mat. The resin composition may contain an inorganic filler. Examples of the inorganic filler include silicas such as natural silica, fused silica, amorphous silica and hollow silica, aluminum compounds such as boehmite, aluminum hydroxide and alumina, magnesium compounds such as magnesium oxide and magnesium hydroxide, calcium compounds such as calcium carbonate, molybdenum compounds such as molybdenum oxide and zinc molybdate, talcs such as natural talc and calcined talc, mica, and glasses such as staple fiber glass, spherical glass and glass micropowder (E glass, T glass, D glass and the like). These can suitably be selected according to objective applications and performance, and can be used singly or in combinations of two or more.

The thickness of the prepreg is not especially limited, and is preferably 15 to 100 μm and more preferably 15 to 80 μm.

As the prepreg, for example, commercially available products, for example A-IN74 (trade name), FF70 (trade name) and SH65 (trade name) manufactured by Mitsubishi Gas Chemical Co., Ltd can also be used.

The third metal foil 14 is not especially limited, and for example, the first metal foil 11 or the second metal foil 12 can be used. The third metal foil 14 may be the same as or different from the first metal foil 11 or the second metal foil 12. Further, as the third metal foil 14, a metal foil with a carrier metal foil may also be used.

The metal foil with a carrier metal foil refers to a laminate sheet having a carrier metal foil and a metal foil (hereinafter, referred to as "thin metal foil") thinner than the carrier metal foil. In detail, the metal foil with a carrier metal foil is the laminate sheet in which the thin metal foil is laminated in a peelable state on the carrier metal foil, as required, through another film, and may also be a commercially available one.

The kinds of metals of the carrier metal foil and the metal foil thinner than the same are not especially limited, and examples of the kinds thereof include gold, silver, copper, aluminum, nickel, iron, chromium, manganese and molybdenum and alloys containing 90% or more of the total of at least one selected from alloys composed of two or more metals thereof. Copper is preferable particularly from the viewpoint of the thermal expansion coefficient, the electroconductivity and the economic efficiency.

The thickness of the carrier metal foil in the metal foil with a carrier metal foil is not especially limited, and is preferably 9 to 70 μm and more preferably 12 to 35 μm. The thickness of the thin metal foil is not especially limited, and is preferably 5 μm or shorter and more preferably 1 to 5 μm.

The material of the another film which, as required, is laminated on the laminate sheet is not especially limited, and examples thereof include polyimide, polyamide, polytetrafluoroethylene (PTFE), acryl resins, polyethylene terephthalate, silicone resins, polybutylene terephthalate (PBT), aramid resins, urea resins, cellophane, polysulfone, ethylene propylene diene rubber (EPDM), polyester, polyethylene, polypropylene, polyester, nylon, polycarbonate, phenol resins, BT resins, triacetate resins, epoxy resins, polyphenylene sulfide, liquid crystal polymer (LCP), polyethylene naphthalate and polyvinyl chloride (PVC). The thickness of the another film layer is not especially limited, and is preferably 0.01 to 100 μm and more preferably 1 to 10 μm.

Examples of commercially available products include MT18Ex (trade name, thickness of carrier copper foil: 18 μm, ultrathin copper foil: 2 μm) and MTFL (trade name, thickness of carrier copper foil: 18 μm, ultrathin copper foil: 3 μm) manufactured by Mitsui Mining & Smelting Co., Ltd.

In the first embodiment, a method for laminating the second insulating resin layer 13 and the third metal foil 14 on the insulating resin layer 10 is not especially limited, and it is preferable that the second insulating resin layer 13 and the third metal foil 14 are laminated in this order on the first insulating resin layer 10 having the patterned second metal foil 12 laminated thereon, and thereafter pressurized in the lamination direction under heating for lamination. Then before the lamination of the second insulating resin layer 13, in order to raise the adhesive strength of the second metal foil 12 with the second insulating resin layer 13, it is preferable that for example, by using Clean Etch® EMR-5100 (trade name) manufactured by Mitsubishi Gas Chemical Co., Ltd. or CZ-8100 (trade name) manufactured by MEC Co., Ltd., the metal foil surface of the second metal foil 12 is subjected to etching (roughening treatment) of 1 to 2 μm.

In the laminate 22 having a patterned metal foil whose second metal foil has been patterned, since the laminate 22 has the high-rigidity first metal foil 11 on one surface of the first insulating resin layer 10, the second insulating resin layer 13 and the third metal foil 14 can suitably be laminated on the insulating resin layer 10 without the first insulating resin layer 10 being destroyed.

The thickness of the laminate 23 is not especially limited, and is usually 30 to 200 μm, preferably 40 to 200 μm and more preferably 45 to 200 μm.

A method for the heating and pressurizing is not especially limited, and examples thereof include vacuum (reduced pressure) hot pressing and vacuum (reduced pressure) lamination. In the case of using the prepreg as the second insulating resin layer 13, the vacuum (reduced pressure) hot pressing is preferable because the adhesive strength can be more raised.

The heating temperature is not especially limited, and is preferably 180 to 230° C. and more preferably 190 to 220° C. When the heating temperature is in the above range, the adhesion of the first insulating resin layer 10, the second metal foil 12, the second insulating resin layer 13 and the third metal foil 14 can be carried out more sufficiently.

The pressurizing pressure is not especially limited, and is preferably 1 to 4 MPa and more preferably 2.5 to 3.5 MPa. When the pressurizing pressure is in the above range, the adhesion of the first insulating resin layer 10, the second metal foil 12, the second insulating resin layer 13 and the third metal foil 14 can be carried out more sufficiently.

The time of the heating and pressurizing is not especially limited, and is preferably 30 to 300 min and more preferably 40 to 120 min. When the time of the heating and pressurizing is in the above range, the adhesion of the first insulating resin layer 10, the second metal foil 12, the second insulating resin layer 13 and the third metal foil 14 can be carried out more sufficiently.

In the laminate 23 having a patterned metal foil according to the first embodiment, in order to electrically connect the third metal foil 14 with the second metal foil 12 and/or the first metal foil 11, it is preferable that a first via hole starting from a surface of the third metal foil 14 and reaching the second metal foil 12 or the first metal foil 11 on an opposite surface is included. The first via hole is allowed to penetrate the second metal foil 12, but does not penetrate the first metal foil 11. The first via hole can suitably be formed according to objective applications.

The first via hole can be obtained by using the laminate 23 having a patterned metal foil according to the first embodiment and carrying out any one or more steps of the following (1) to (3).

(1) A step of irradiating a predetermined position of a surface of the third metal foil 14 with a laser beam to provide a first via hole starting from the surface of the third metal foil 14, penetrating the third metal foil 14 and the second insulating resin layer 13 and reaching the second metal foil 12 on the opposite surface.

(2) A step of irradiating a predetermined position of a surface of the third metal foil 14 with a laser beam to provide a first via hole starting from the surface of the third metal foil 14, penetrating the third metal foil 14, the second insulating resin layer 13 and the first insulating resin layer 10 and reaching the first metal foil 11 on the opposite surface.

(3) A step of irradiating a predetermined position of a surface of the third metal foil 14 with a laser beam to provide a first via hole starting from the surface of the third metal foil 14, penetrating the third metal foil 14, the second insulating resin layer 13, the second metal foil 12 and the first insulating resin layer 10 and reaching the first metal foil 11 on the opposite surface.

The first via hole is obtained by drilling so as not to penetrate the first metal foil 11. Then, the predetermined position refers to a suitable position according to the circuit pattern.

A laser beam processing method is not especially limited, and processing methods used in usual production of multilayer printed wiring boards, including processing methods using carbon dioxide laser and processing methods using UV laser can suitably be used. The first via hole may be formed by using a mechanical drill.

The shape of the first via hole is not especially limited, and suffices if being a shape formed in usual production of multilayer printed wiring boards, for example, a circular shape, a nearly circular shape, an elliptic shape or a nearly elliptic shape, as viewed from the surface of the third metal foil 14. The shape of the cross section of the first via hole parallel to the lamination direction is not also especially limited, and suffices if being a shape formed in usual production of multilayer printed wiring boards, such as a square shape, a nearly square shape, a rectangular shape, a nearly rectangular shape, a trapezoidal shape or a nearly trapezoidal shape.

The size of the first via hole is not especially limited, and suffices if being a size formed in usual production of multilayer printed wiring boards. Usually, the cross-sectional area of the hole as viewed from the surface of the third metal foil 14 (that is, an area of any cross section orthogonal to the lamination direction of the third metal foil 14) is 0.0003 to 3 $mm^2$. The depth of the first via hole is also not especially limited, and suffices if being a depth formed in usual production of multilayer printed wiring boards. Usually, the depth of the first via hole is 5 to 200 μm.

In the first embodiment, a through-hole penetrating from the third metal foil 14 to the first metal foil 11 may suitably be provided.

In the first embodiment, it is preferable that the production method further contains a step of subjecting the first via hole inside to a desmear treatment. In the present embodiment, the desmear treatment refers to a treatment of removing smears such as resins that are generated when a via hole is formed and adhere to the inside of the via hole.

A method of the desmear treatment and the kind of a chemical solution to be used for the desmear treatment are not especially limited, and a method of desmear treatment and a chemical solution in usual production of multilayer printed wiring boards can suitably be used. The method of desmear treatment is not especially limited, and examples thereof include treatment with a swelling liquid, treatment with a desmear liquid and treatment with a neutralizing liquid. The chemical solution to be used in the desmear treatment may also be a commercially available product.

The condition of the desmear treatment is not especially limited, and is suitably selected according to the kind of the insulating resin, the kind and the concentration of the chemical solution, and the like. The method of desmear treatment is not especially limited, and examples thereof include a method in which the via hole and as required, the through-hole according to the present embodiment are dipped in a swelling liquid for desmear treatment (PTH-B103 (trade name)) manufactured by Okuno Chemical Industries Co., Ltd. at 65° C. for 5 min for swelling, thereafter dipped in a desmear treatment liquid (PTH1200 (trade name) and PTH1200NA (trade name)) manufactured by Okuno Chemical Industries Co., Ltd. at 80° C. for 8 min, and finally dipped in a neutralizing liquid for desmear treatment (PTH-B303 (trade name)) manufactured by Okuno Chemical Industries Co., Ltd. at 45° C. for 5 min.

In the first embodiment, after the first via hole is provided or after the desmear treatment of the first via hole inside is carried out, in order to electrically connect the third metal foil 14 with the second metal foil 12 and/or the first metal foil 11, it is preferable that a metal plating treatment is carried out.

A method of the metal plating treatment is not especially limited, and a method of metal plating treatment in usual production of multilayer printed wiring boards can suitably be used. The method of the metal plating treatment and the kind of a chemical solution to be used for the plating are not especially limited, and a method of metal plating treatment and a chemical solution in usual production of multilayer printed wiring boards can suitably be used. The chemical solution to be used for the metal plating treatment may also be a commercially available product.

The metal plating treatment method is not especially limited, and examples thereof include treatment with a degreasing liquid, treatment with a soft etchant, washing with an acid, treatment with a predipping solution, treatment with a catalyst liquid, treatment with an accelerator solution, treatment with a chemical copper solution, and a treatment in which acid washing is carried out, the object is dipped in a copper sulfate solution, and a current is made to flow.

Specific examples of the metal plating treatment method include a method in which after an electroless plating film is formed on the first via hole inner wall by a usual electroless plating treatment, the first via hole inside is filled with plating by an electroplating method such as a sparger plating method in which a plating solution is dashed in a jet form against a substrate. The electroless plating or the electroplating is preferably, for example, metal plating of copper, tin, silver, various types of solders, copper and tin, copper and silver, or the like, and more preferably copper electroless plating or copper electroplating.

In the case of using the laminate 23 having a patterned metal foil according to the first embodiment in order to fabricate a laminate 25 having a patterned metal foil according to the second embodiment described later, for the purpose of positioning for forming a circuit pattern by exposure or laser beam processing, it is preferable that a hole for positioning is provided in the laminate 23 having a patterned metal foil according to the first embodiment. In this case, it is preferable that a hole is further provided in the circumference of the hole for positioning. A method for forming the hole for positioning and the hole in the circumference of the hole for positioning is not especially limited, and a well-known drilling method in usual production of multilayer printed wiring boards can be used, and for example, a method of drilling by a drill or a method of drilling by X-rays or laser beams can be used.

[The Laminate Having a Patterned Metal Foil and the Method for Producing the Same According to the Second Embodiment]

The laminate 25 having a patterned metal foil according to the second embodiment contains a first insulating resin layer 10 having a thickness of 1 to 200 µm; a first metal foil 11 laminated and patterned on one surface of the first insulating resin layer 10; a third insulating resin layer 15 laminated on the first insulating resin layer 10 having the first metal foil 11 laminated thereon and covering the first metal foil 11; a fourth metal foil 16 laminated on the third insulating resin layer 15; a second metal foil 12 laminated and patterned on the surface of the first insulating resin layer 10 opposite to the surface having the first metal foil 11 laminated thereon; a second insulating resin layer 13 laminated on the first insulating resin layer 10 having the second metal foil 12 laminated thereon and covering the second metal foil 12; and a third metal foil 14 laminated on the second insulating resin layer 13.

Then, the method for producing the laminate 25 having a patterned metal foil according to the second embodiment contains a step of masking a whole surface of the third metal foil 14 in the laminate 23 having a patterned metal foil according to the first embodiment; a step of patterning the first metal foil 11; a step of laminating the third insulating resin layer 15 on the first insulating resin layer 10 having the first metal foil 11 laminated thereon so that the first metal foil 11 is covered with the third insulating resin layer 15; and a step of laminating the fourth metal foil 16 on the third insulating resin layer 15.

In the production method of the laminate 25 having a patterned metal foil according to the second embodiment, since the second metal foil 12, the second insulating resin layer 10 and the third metal foil 14 are laminated on one surface of the thin first insulating resin layer 10, the rigidity of the whole of the laminate 23 can be held. Hence, the first metal foil 11 can suitably be patterned without the thin insulating resin layer 10 being destroyed.

Further, according to the method for producing the laminate 25 having a patterned metal foil according to the second embodiment, the laminate 25 can be produced by using the thin first insulating resin layer 10 without using a high-rigidity thick support substrate (carrier substrate). Hence, the amount of material wastes is enabled to be greatly reduced, and since a step of producing a laminate containing a support substrate and a step of peeling and removing the support substrate can be eliminated, the production method is high in versatility to production processes.

The laminate 25 having a patterned metal foil according to the second embodiment, since having the thin first insulating resin layer 10, can suitably be used for a printed wiring board and a substrate for loading semiconductor devices with the aim of their thickness reduction.

The thickness of the laminate 25 is not especially limited, and is usually 30 to 300 µm, preferably 40 to 300 µm and more preferably 45 to 300 µm.

In the second embodiment, the first insulating resin layer 10, the first metal foil 11, the second metal foil 12, the laminate 21, the second insulating resin layer 13, the third metal foil 14 and the laminate 23 are as described in the above.

In the second embodiment, a laminate 25 having a patterned metal foil whose first metal foil 11 and second metal foil 12 have been patterned is obtained by masking the whole surface of the third metal foil 14 in the laminate 23 having a patterned metal foil according to the first embodiment and patterning the first metal foil 11. The masking and the patterning can use well-known masking and patterning carried out in production of printed wiring boards, and are not especially limited, and it is preferable that masking of the whole surface of the third metal foil 14 and patterning (forming a circuit pattern) of the first metal foil 11 are carried out, for example, by a subtractive process.

In the laminate 24 having a patterned metal foil whose first metal foil and second metal foil have been patterned, since the rigidity of the whole of the laminate can be held, the third insulating resin layer 15 and the fourth metal foil 16 can suitably be laminated on the insulating resin layer 10 without the thin first insulating resin layer 10 being destroyed.

The masking and patterning by the subtractive process can be carried out, for example, as follows. On the whole surfaces of the first metal foil 11 and the third metal foil 14 in the laminate 23 having a patterned metal foil according to the first embodiment, a dry film resist (for example, RD-1225 (trade name) manufactured by Hitachi Chemical Co., Ltd.) was laminated at a temperature of 110±10° C. and a pressure of 0.50±0.02 MPa. Then, exposure is carried out on the whole surface of the third metal foil 14 and according to the circuit pattern of the first metal foil 11 for masking. Thereafter, the dry film resist of both the surfaces is subjected to a development treatment with a 1% sodium carbonate aqueous solution, and portions of the first metal foil 11 which are not covered with the etching resist are removed with a cupric chloride aqueous solution; and finally, the dry film resist is stripped in an amine-based resist stripping solution. Thereby, the laminate 24 having a patterned metal foil whose first metal foil 11 and second metal foil 12 have been patterned can be formed.

In the second embodiment, a third insulating resin layer 15 is laminated on the first insulating resin layer 10 so that the patterned first metal foil 11 is covered with the third insulating resin layer 15, and a fourth metal foil 16 is laminated on the third insulating resin layer 15.

The third insulating resin layer 15 is not especially limited, and for example, the same material or prepreg as for the first insulating resin layer 10 and the second insulating resin layer 13 can be used, but it is preferable to use the prepreg from the viewpoint of the thermal expansion and the heat resistance. The prepreg is as described in the above, and may be the same as or different from the prepreg used for forming the second insulating resin layer 13.

The fourth metal foil 16 is not especially limited, and for example, the first metal foil 11, the second metal foil 12 or the third metal foil 14 can be used. The fourth metal foil 16 may be the same as or different from the first metal foil 11, the second metal foil 12 or the third metal foil 14. Further, as the fourth metal foil 16, a metal foil with a carrier metal foil may also be used. The metal foil with a carrier metal foil is as described in the above, and may be the same as or different from the metal foil with a carrier metal foil of the third metal foil 14.

Then, as the kind of a metal of the fourth metal foil 16, a metal of the first metal foil 11, a metal of the second metal foil 12 or a metal of the third metal foil 14 can be used, and the metal may be the same as or different from the metal of the first metal foil 11, the metal of the second metal foil 12 or the metal of the third metal foil 14.

In the second embodiment, a method for laminating the third insulating resin layer 15 and the fourth metal foil 16 on the first insulating resin layer 10 is not especially limited, and it is preferable that the third insulating resin layer 15 and the fourth metal foil 16 are laminated in this order on the first insulating resin layer 10 having the patterned first metal foil 11 laminated thereon, and thereafter pressurized in the lamination direction under heating for lamination. Then before the lamination of the third insulating resin layer 15, in order to raise the adhesive strength of the first metal foil 11 with the third insulating resin layer 15, it is preferable that for example, by using Clean Etch® EMR-5100 (trade name) manufactured by Mitsubishi Gas Chemical Co., Ltd. or CZ-8100 (trade name) manufactured by MEC Co., Ltd., the metal foil surface of the first metal foil 11 is subjected to etching (roughening treatment) of 1 to 2 µm.

A method for the heating and pressurizing is not especially limited, and examples thereof include vacuum (reduced pressure) hot pressing and vacuum (reduced pressure) lamination. In the case of using the prepreg as the third insulating resin layer 15, the vacuum (reduced pressure) hot pressing is preferable because the adhesive strength can be more raised.

The heating temperature is not especially limited, and is preferably 180 to 230° C. and more preferably 190 to 220° C. When the heating temperature is in the above range, the adhesion of the first insulating resin layer 10, the first metal foil 11, the third insulating resin layer 15 and the fourth metal foil 16 can be carried out more sufficiently.

The pressurizing pressure is not especially limited, and is preferably 1 to 4 MPa and more preferably 2.5 to 3.5 MPa. When the pressurizing pressure is in the above range, the adhesion of the first insulating resin layer 10, the first metal foil 11, the third insulating resin layer 15 and the fourth metal foil 16 can be carried out more sufficiently.

The time of the heating and pressurizing is not especially limited, and is preferably 30 to 300 min and more preferably 40 to 120 min. When the time of the heating and pressurizing is in the above range, the adhesion of the first insulating resin layer 10, the first metal foil 11, the third insulating resin layer 15 and the fourth metal foil 16 can be carried out more sufficiently.

For the purpose of positioning for forming a circuit pattern by exposure or laser beam processing, it is preferable that a hole for positioning is provided in the laminate 25 having a patterned metal foil according to the second embodiment. In this case, it is preferable that a hole is further provided in the circumference of the hole for positioning. A method for forming the hole for positioning and the hole in the circumference of the hole for positioning is not especially limited, and a well-known drilling method in usual production of multilayer printed wiring boards can be used, and for example, a method of drilling by a drill or a method of drilling by X-rays or laser beams can be used.

In the laminate 25 having a patterned metal foil according to the second embodiment, in order to electrically connect the third metal foil 14 with any one or more of the second metal foil 12, the first metal foil 11 and the fourth metal foil 16, it is preferable that a second via hole starting from a surface of the third metal foil 14 and reaching any one of the second metal foil 12, the first metal foil 11 and the fourth metal foil 16 on an opposite surface is included. The second via hole is such a non-through hole that the third metal foil 14 can be connected with any one or more of the second metal foil 12, the first metal foil 11 and the fourth metal foil 16, and the non-through hole may be formed so that the third metal foil 14, the second metal foil 12, the first metal foil 11 and the fourth metal foil 16 can all be electrically connected. The second via hole is allowed to penetrate the second metal foil 12 and/or the first metal foil 11, but does not penetrate the fourth metal foil 16. The second via hole can suitably be formed according to objective applications.

The second via hole can be obtained by using the laminate 25 having a patterned metal foil according to the second embodiment and carrying out any one or more steps of the following (1) to (6).

(1) A step of irradiating a predetermined position of a surface of the third metal foil 14 with a laser beam to provide a second via hole starting from the surface of the third metal foil 14, penetrating the third metal foil 14 and the second insulating resin layer 13 and reaching the second metal foil 12 on the opposite surface.

(2) A step of irradiating a predetermined position of a surface of the third metal foil 14 with a laser beam to provide a second via hole starting from the surface of the third metal foil 14, penetrating the third metal foil 14, the second insulating resin layer 13 and the first insulating resin layer 10 and reaching the first metal foil 11 on the opposite surface.

(3) A step of irradiating a predetermined position of a surface of the third metal foil 14 with a laser beam to provide a second via hole starting from the surface of the third metal foil 14, penetrating the third metal foil 14, the second insulating resin layer 13, the second metal foil 12 and the first insulating resin layer 10 and reaching the first metal foil 11 on the opposite surface.

(4) A step of irradiating a predetermined position of a surface of the third metal foil 14 with a laser beam to provide a second via hole starting from the surface of the third metal foil 14, penetrating the third metal foil 14, the second insulating resin layer 13, the second metal foil 12, the first insulating resin layer 10 and the third insulating resin layer 15 and reaching the fourth metal foil 16 on the opposite surface.

(5) A step of irradiating a predetermined position of a surface of the third metal foil 14 with a laser beam to provide a second via hole starting from the surface of the third metal foil 14, penetrating the third metal foil 14, the second insulating resin layer 13, the first insulating resin layer 10, the first metal foil 11 and the third insulating resin layer 15 and reaching the fourth metal foil 16 on the opposite surface.

(6) A step of irradiating a predetermined position of a surface of the third metal foil 14 with a laser beam to provide a second via hole starting from the surface of the third metal foil 14, penetrating the third metal foil 14, the second insulating resin layer 13, the second metal foil 12, the first insulating resin layer 10, the first metal foil 11 and the third insulating resin layer 15 and reaching the fourth metal foil 16 on the opposite surface.

The second via hole is obtained by drilling so as not to penetrate the fourth metal foil 16. Then, the predetermined position refers to a suitable position according to the circuit pattern.

In the laminate 25 having a patterned metal foil according to the second embodiment, in order to electrically connect the fourth metal foil 16 with any one or more of the first metal foil 11, the second metal foil 12 and the third metal foil 14, it is preferable that a third via hole starting from a surface of the fourth metal foil 16 and reaching any one of the first metal foil 11, the second metal foil 12 and the third metal foil 14 on an opposite surface is included. The third via hole is such a non-through hole that the fourth metal foil 16 can be connected with any one or more metal foils of the first metal foil 11, the second metal foil 12 and the third metal foil 14, and the non-through hole may be formed so that the fourth metal foil 16, the first metal foil 11, the second metal foil 12 and the third metal foil 14 can all be electrically connected. The third via hole is allowed to penetrate the first metal foil 11 and/or the second metal foil 12, but does not penetrate the third metal foil 14. The third via hole can suitably be formed according to objective applications.

The third via hole can be obtained by using the laminate 25 having a patterned metal foil according to the second embodiment, or the laminate 25 having a patterned metal foil according to the second embodiment and having the second via hole, and carrying out any one or more steps of the following (1) to (6).

(1) A step of irradiating a predetermined position of a surface of the fourth metal foil 16 with a laser beam to provide a third via hole starting from the surface of the fourth metal foil 16, penetrating the fourth metal foil 16 and the third insulating resin layer 15 and reaching the first metal foil 11 on the opposite surface.

(2) A step of irradiating a predetermined position of a surface of the fourth metal foil 16 with a laser beam to provide a third via hole starting from the surface of the fourth metal foil 16, penetrating the fourth metal foil 16, the third insulating resin layer 15 and the first insulating resin layer 10 and reaching the second metal foil 12 on the opposite surface.

(3) A step of irradiating a predetermined position of a surface of the fourth metal foil 16 with a laser beam to provide a third via hole starting from the surface of the fourth metal foil 16, penetrating the fourth metal foil 16, the third insulating resin layer 15, the first metal foil 11 and the first insulating resin layer 10 and reaching the second metal foil 12 on the opposite surface.

(4) A step of irradiating a predetermined position of a surface of the fourth metal foil 16 with a laser beam to provide a third via hole starting from the surface of the fourth metal foil 16, penetrating the fourth metal foil 16, the third insulating resin layer 15, the first metal foil 11, the first insulating resin layer 10 and the second insulating resin layer 13 and reaching the third metal foil 14 on the opposite surface.

(5) A step of irradiating a predetermined position of a surface of the fourth metal foil 16 with a laser beam to provide a third via hole starting from the surface of the fourth metal foil 16, penetrating the fourth metal foil 16, the third insulating resin layer 15, the first insulating resin layer 10, the second metal foil 12 and the second insulating resin layer 13 and reaching the third metal foil 14 on the opposite surface.

(6) A step of irradiating a predetermined position of a surface of the fourth metal foil 16 with a laser beam to provide a third via hole starting from the surface of the fourth metal foil 16, penetrating the fourth metal foil 16, the third insulating resin layer 15, the first metal foil 11, the first insulating resin layer 10, the second metal foil 12 and the second insulating resin layer 13 and reaching the third metal foil 14 on the opposite surface.

The third via hole is obtained by drilling so as not to penetrate the third metal foil 14. Then, the predetermined position refers to a suitable position according to the circuit pattern.

Methods for forming the second via hole and the third via hole are not especially limited, and processing methods carried out in usual production of multilayer printed wiring boards, such as methods using carbon dioxide laser, processing methods using UV laser and processing methods using a mechanical drill can suitably be used. The formations of the second via hole and the third via hole may be carried out simultaneously or successively.

The shape of the second via hole or the third via hole is not especially limited, and suffices if being a shape formed in usual production of multilayer printed wiring boards, for example, a circular shape, a nearly circular shape, an elliptic shape or a nearly elliptic shape, as viewed from the surface of the third metal foil 14 or the fourth metal foil 16. The shape of the cross section of the second via hole or the third via hole parallel to the lamination direction is not also especially limited, and suffices if being a shape formed in usual production of multilayer printed wiring boards, for example, a square shape, a nearly square shape, a rectangular shape, a nearly rectangular shape, a trapezoidal shape or a nearly trapezoidal shape.

The size of the second via hole or the third via hole is not especially limited, and suffices if being a size formed in usual production of multilayer printed wiring boards. Usually, the cross-sectional area of the hole as viewed from the surface of the third metal foil 14 or the fourth metal foil 16 (that is, an area of any cross section orthogonal to the lamination direction of the third metal foil 14 or the fourth metal foil 16) is 0.0003 to 3 $mm^2$. The depth of the second via hole or the third via hole is also not especially limited, and suffices if being a depth formed in usual production of multilayer printed wiring boards. Usually, the depth of the second via hole or the third via hole is 5 to 200 μm.

In the second embodiment, a through-hole penetrating from the third metal foil 14 to the fourth metal foil 16 may suitably be provided.

In the second embodiment, it is preferable that the production method further contains a step of subjecting the second via hole inside and/or the third via hole inside to a desmear treatment.

A method of the desmear treatment, the kind of a chemical solution to be used for the desmear treatment and the condition of the desmear treatment are not especially limited, and the method, the kind and the condition can suitably be selected, for example, from the above-mentioned method of the desmear treatment of the first via hole inside, chemical solution used for the desmear treatment and condition of the desmear treatment, according to objective applications.

In the second embodiment, after the second via hole and/or the third via hole is provided or after the desmear treatment of the second via hole inside and/or the third via hole inside is carried out, in order to electrically connect between the each metal foil in the laminate 25 having a patterned metal foil according to the second embodiment, it is preferable that a metal plating treatment is carried out.

A method of the metal plating treatment is not especially limited, and a method of metal plating treatment in usual production of multilayer printed wiring boards can suitably be used. Then, a specific method of the metal plating treatment and kind of a chemical solution to be used for the plating can suitably be selected from the method of the metal plating treatment and the kind of a chemical solution in the above-mentioned first embodiment.

[Laminate Having a Patterned Metal Foil and Having a Buildup Structure]

In the present embodiments, on one surface or both surfaces of the laminate having a patterned metal foil according to the first embodiment or the laminate having a patterned metal foil according to the second embodiment, metal foils and insulating resin layers are further laminated, and are pressurized in the lamination direction under heating, whereby a laminate having a patterned metal foil and having a buildup structure can be obtained. The numbers of lamination of the metal foils and the insulating resin layers are not especially limited, and can suitably be established according to objective applications. Further, also the order in which the metal foils and the insulating resin layers are laminated is not especially limited.

A metal of the metal foils is also not especially limited, and for example, a metal of the first metal foil 11 or the second metal foil 12 can be used, and the metal may be the same as or different from the metal of the first metal foil 11 or the second metal foil 12. The insulating resin layer is also not especially limited, and the same material or prepreg as for the first insulating resin layer 10 can be used, and it is preferable to use the prepreg, from the viewpoint of the thermal expansion and the heat resistance. The prepreg is as described in the above, and may be the same as or different from the prepreg used for forming the second insulating resin layer 13.

A heating method, a pressurizing method and times thereof when the metal foils and the insulating resin layers are laminated are also not especially limited, and can suitably be selected according to objective applications. A specific heating method, pressurizing method and times thereof can suitably be selected from the heating method, the pressurizing method and the times thereof in the above-mentioned first embodiment and second embodiment.

The laminate having a patterned metal foil and having a buildup structure may suitably have a via hole and/or a through-hole according to objective applications. Methods for forming the via hole and the through-hole are not especially limited, and can suitably use processing methods carried out in usual production of multilayer printed wiring boards, such as processing methods using carbon dioxide laser, processing methods using UV laser and. processing methods using a mechanical drill The shapes, sizes and depths of the via hole and the through-hole are not especially limited, and can suitably be established according to objective applications. The shapes, sizes and depths of the via hole and the through-hole can suitably be selected from the shapes, the sizes and the depths in the above-mentioned first embodiment and second embodiment.

Then, it is preferable that the via hole inside and/or the through-hole inside has been subjected to a desmear treatment. A method of the desmear treatment is not especially limited, and methods of the desmear treatment in usual production of multilayer printed wiring boards can suitably be used. Further, a specific desmear treatment method, kind of a chemical solution to be used for the desmear treatment and condition of the desmear treatment can suitably be selected from the desmear treatment method, the kind of a chemical solution to be used for the desmear treatment and the condition of the desmear treatment in the above-mentioned first embodiment and second embodiment.

In the present embodiments, after the via hole and as required the through-hole is provided in the laminate having a patterned metal foil and having a buildup structure or after the desmear treatment is carried out on the via hole inside and as required, the through-hole inside, in order to electrically connect between the each metal foil, a metal plating treatment may be carried out.

A method of the metal plating is not especially limited, and methods of metal plating treatment in usual production of multilayer printed wiring boards can suitably be used. Further, a specific method of the metal plating treatment and the kind of a chemical solution to be used for the plating can suitably be selected from the method of the metal plating treatment and the kind of a chemical solution used for the plating in the above-mentioned first embodiment and second embodiment.

[Substrate for Loading Semiconductor Devices]

The substrate for loading semiconductor devices is fabricated by masking and patterning both surfaces or one surface of the laminate having a patterned metal foil according to the first embodiment, the laminate having a patterned metal foil according to the second embodiment or the laminate having a patterned metal foil and having a buildup structure. The masking and the patterning can use well-known masking and patterning carried out in production of printed wiring boards, and are not especially limited, and it is preferable to form circuit patterns by a subtractive process. The subtractive process can be used suitably by reference to the subtractive process in the above-mentioned first embodiment or second embodiment. The circuit pattern may be formed on only one surface or both surfaces of the laminate.

The laminate having a patterned metal foil according to the first embodiment, the laminate having a patterned metal foil according to the second embodiment or the laminate having a patterned metal foil and having a buildup structure is few in appearance defects and uniform. The use of the laminate according to the present embodiments makes the productivity of the thin printed wiring board and the thin substrate for loading semiconductor devices to be better than conventionally.

EXAMPLES

Examples according to the present embodiments will be described by way of FIG. 1, but the present embodiments are not any more limited to these Examples.

Example 1

On each of both surfaces of a laminate 21 (C2006 (trade name) manufactured by 3M Co.) in which a copper foil (first metal foil 11), a first insulating resin layer 10 and a copper foil (second metal foil 12) were laminated in this order, (wherein the composition of the first insulating resin layer 10 contained an epoxy resin and barium titanate; the thickness of the first insulating resin layer 10 was 6 µm; the thickness of the copper foils in the first metal foil 11 and the second metal foil 12 was 3.5 µm; and the thickness of the laminate 21 was 13 µm), a photosensitive dry film resist (RD-1225 (trade name) manufactured by Hitachi Chemical Co., Ltd.) was laminated. Thereafter, the laminated dry film resist on one surface (the surface of the second metal foil 12) was exposed according to a predetermined circuit pattern, and the laminated dry film resist on the other surface (the surface of the first metal foil 11) was flood-exposed for masking. Thereafter, the resultant was subjected to developing treatment, etching treatment and resist stripping to thereby form a laminate 22 having a patterned metal foil whose second metal foil had been patterned.

In order to raise the adhesive strength of the second metal foil 12 (first circuit pattern layer) in the laminate 22 having a patterned metal foil whose second metal foil had been patterned with a second insulating resin layer 13, the copper of the surface of the second metal foil 12 was subjected to roughening treatment using Clean Etch® EMR-5100 (trade name) manufactured by Mitsubishi Gas Chemical Co., Ltd. Then, a prepreg (A-IN74 (trade name) manufactured by Mitsubishi Gas Chemical Co., Ltd.) having a thickness of 0.040 mm as the second insulating resin layer 13 and an ultrathin copper foil with a carrier copper foil (MT18Ex (trade name) manufactured by Mitsui Mining & Smelting Co., Ltd., thickness of carrier copper foil: 18 µm, ultrathin copper foil: 2 μm) as a third metal foil 14 were disposed on the surface of the first insulating resin layer 10 having the second metal foil 12 laminated thereon so that the carrier copper foil surface became the outermost surface, and were subjected to a pressing treatment under vacuum at a temperature of 200° C. and a pressing pressure of 3 MPa for 60 min. Thereby, a laminate 23 having a patterned metal foil (thickness of the laminate 23: 60 μm) according to the first embodiment was formed.

Then, using an X-ray drilling apparatus, a hole for positioning was formed in the laminate 23 having a patterned metal foil according to the first embodiment. Thereafter, on each of both surfaces (respective surfaces of the first metal foil 11 and the third metal foil 14) of the laminate, a photosensitive dry film resist (RD-1225 (trade name) manufactured by Hitachi Chemical Co., Ltd.) was laminated. Thereafter, the laminated dry film resist on one surface (the surface of the first metal foil 11) was exposed according to a predetermined circuit pattern, and the laminated dry film resist on the other surface (the surface of the third metal foil 14) was flood-exposed for masking. Thereafter, the resultant was subjected to developing treatment, etching treatment and resist stripping to thereby form a laminate 24 having a patterned metal foil whose first metal foil and second metal foil had been patterned.

In order to raise the adhesive strength of the first metal foil 11 (second circuit pattern layer) in the laminate 24 with a third insulating resin layer 15, the copper of the surface of the first metal foil 11 was subjected to roughening treatment using Clean Etch® EMR-5100 (trade name) manufactured by Mitsubishi Gas Chemical Co., Ltd. Then, a prepreg (A-IN74 (trade name) manufactured by Mitsubishi Gas Chemical Co., Ltd.) having a thickness of 0.040 mm as the third insulating resin layer 15 and an ultrathin copper foil with a carrier copper foil (MT18Ex (trade name) manufactured by Mitsui Mining & Smelting Co., Ltd., thickness of carrier copper foil: 18 μm, thickness of ultrathin copper foil: 2 μm) as a fourth metal foil 16 were disposed on the surface of the first insulating resin layer 10 having the first metal foil 11 laminated thereon so that the carrier copper foil surface became the outermost surface, and were subjected to a pressing treatment under vacuum at a temperature of 220° C. and a pressing pressure of 3 MPa for 120 min. Thereby, a laminate 25 having a patterned metal foil (thickness of the laminate 25: 100 μm) according to the second embodiment was formed.

Then, using an X-ray drilling apparatus, a hole for positioning was formed in the laminate 25 having a patterned metal foil according to the second embodiment. Then, the carrier copper foils on the outermost surfaces of the laminate were physically peeled.

Then, by a carbon dioxide laser instrument (ML605GTW3(-H) 5200U (trade name) manufactured by Mitsubishi Electric Corp.), a via hole having a hole diameter of 100 μm starting from a surface of the third metal foil 14 and reaching the second metal foil 12 (first circuit pattern layer), and a via hole having a hole diameter of 100 μm starting from a surface of the fourth metal foil 16 and reaching the first metal foil 11 (second circuit pattern layer) were formed. Then, the via hole insides were subjected to desmear treatment. The desmear treatment was carried out by dipping in a swelling liquid for desmear treatment (PTH-B103 (trade name)) manufactured by Okuno Chemical Industries Co., Ltd. at 65° C. for 5 min for swelling, thereafter dipping in a desmear treatment liquid (PTH1200 (trade name) and PTH1200NA (trade name)) manufactured by Okuno Chemical Industries Co., Ltd. at 80° C. for 8 min, and finally dipping in a neutralizing liquid for desmear treatment (PTH-B303 (trade name)) manufactured by Okuno Chemical Industries Co., Ltd. at 45° C. for 5 min.

Then, on the inner walls of the via holes, a plating layer having a thickness of 0.4 to 0.8 μm was formed by electroless plating, and thereafter, a plating layer of 15 to 30 μm was formed by cupric sulfate plating using copper sulfate (concentration: 60 to 80 g/L) and sulfuric acid (concentration: 150 to 200 g/L). Thereby, the third metal foil 14 and the second metal foil 12 (first circuit pattern layer), and the fourth metal foil 16 and the first metal foil 11 (second circuit pattern layer) were electrically connected through the plating portions of the respective via holes.

Thereafter, on each of both surfaces of the laminate having a patterned metal foil, a photosensitive dry film resist (RD-1225 (trade name) manufactured by Hitachi Chemical Co., Ltd.) was laminated. Thereafter, a third and fourth circuit patterns were formed on the surfaces of the laminate having a patterned metal foil by a subtractive method in which predetermined circuit patterns were exposed after the above-mentioned hole for positioning, and the resultants were subjected to developing treatment, further etching treatment and resist stripping, to thereby obtain a package substrate for loading semiconductor devices (substrate for loading semiconductor devices).

Example 2

A laminate 21 was formed by laminating a copper foil (3EC-VLP (trade name) manufactured by Mitsui Mining & Smelting Co., Ltd., the thickness of the copper foil: 12 μm) on the surface of a first insulating resin layer 10 of a resin sheet with a copper foil in which a copper foil and the first insulating resin layer 10 were laminated in this order (CRS-381NSI (trade name) manufactured by Mitsubishi Gas Chemical Co., Ltd., the composition of the first insulating resin layer 10 contained bismaleimide and silica; the thickness of the first insulating resin layer 10 was 10 μm; the thickness of the copper foil was 12 μm; and the thickness of the laminate 21 was 34 μm). A photosensitive dry film resist (RD-1225 (trade name) manufactured by Hitachi Chemical Co., Ltd.) was laminated on each of both surfaces of the copper foil of the laminate 21. Thereafter, the laminated dry film resist on one surface (the surface of the second metal foil 12) was exposed according to a predetermined circuit pattern, and the laminated dry film resist on the other surface (the surface of the first metal foil 11) was flood-exposed for masking. Thereafter, the resultant was subjected to developing treatment, etching treatment and resist stripping to thereby form a laminate 22 having a patterned metal foil whose second metal foil had been patterned.

In order to raise the adhesive strength of the second metal foil 12 (first circuit pattern layer) in the laminate 22 having a patterned metal foil whose second metal foil had been patterned with a second insulating resin layer 13, the copper of the surface of the second metal foil 12 was subjected to roughening treatment using Clean Etch® EMR-5100 (trade name) manufactured by Mitsubishi Gas Chemical Co., Ltd. Then, a prepreg (A-IN74 (trade name) manufactured by Mitsubishi Gas Chemical Co., Ltd.) having a thickness of 0.040 mm as the second insulating resin layer 13 and an ultrathin copper foil with a carrier copper foil (MT18Ex (trade name) manufactured by Mitsui Mining & Smelting Co., Ltd., thickness of carrier: 18 μm, ultrathin copper foil: 2 μm) as a third metal foil 14 were disposed on the surface of the first insulating resin layer 10 having the second metal foil 12 laminated thereon so that the carrier copper foil surface became the outermost surface, and were subjected to a pressing treatment under vacuum at a temperature of 200° C. and a pressing pressure of 3 MPa for 60 min. Thereby, a laminate 23 having a patterned metal foil (thickness of the laminate 23: 80 µm) according to the first embodiment was formed.

Then, using an X-ray drilling apparatus, a hole for positioning was formed in the laminate 23 having a patterned metal foil according to the first embodiment. Thereafter, on each of both surfaces (respective surfaces of the first metal foil 11 and the third metal foil 14) of the laminate, a photosensitive dry film resist (RD-1225 (trade name) manufactured by Hitachi Chemical Co., Ltd.) was laminated. Thereafter, the laminated dry film resist on one surface (the surface of the first metal foil 11) was exposed according to a predetermined circuit pattern, and the laminated dry film resist on the other surface (the surface of the third metal foil 14) was flood-exposed for masking. Thereafter, the resultant was subjected to developing treatment, etching treatment and resist stripping to thereby form a laminate 24 having a patterned metal foil whose first metal foil and second metal foil had been patterned.

In order to raise the adhesive strength of the first metal foil 11 (second circuit pattern layer) in the laminate 24 with a third insulating resin layer 15, the copper of the surface of the first metal foil 11 was subjected to roughening treatment using Clean Etch® EMR-5100 (trade name) manufactured by Mitsubishi Gas Chemical Co., Ltd. Then, a prepreg (A-IN74 (trade name) manufactured by Mitsubishi Gas Chemical Co., Ltd.) having a thickness of 0.040 mm as the third insulating resin layer 15 and an ultrathin copper foil with a carrier copper foil (MT18Ex (trade name) manufactured by Mitsui Mining & Smelting Co., Ltd., thickness of carrier: 18 µm, thickness of ultrathin copper foil: 2 µm) as a fourth metal foil 16 were disposed on the surface of the first insulating resin layer 10 having the first metal foil 11 laminated thereon so that the carrier copper foil surface became the outermost surface, and were subjected to a pressing treatment under vacuum at a temperature of 220° C. and a pressing pressure of 3 MPa for 120 min. Thereby, a laminate 25 having a patterned metal foil (thickness of the laminate 25: 130 µm) according to the second embodiment was formed.

Then, using an X-ray drilling apparatus, a hole for positioning was formed in the laminate 25 having a patterned metal foil according to the second embodiment. Then, the carrier copper foils on the outermost surfaces of the laminate were physically peeled.

Then, by a carbon dioxide laser instrument (ML605GTW3(-H) 5200U (trade name) manufactured by Mitsubishi Electric Corp.), a via hole having a hole diameter of 100 µm starting from a surface of the third metal foil 14 and reaching the second metal foil 12 (first circuit pattern layer), and a via hole having a hole diameter of 100 µm starting from a surface of the fourth metal foil 16 and reaching the first metal foil 11 (second circuit pattern layer) were formed. Then, the via hole insides were subjected to desmear treatment. The desmear treatment was carried out by dipping in a swelling liquid for desmear treatment (PTH-B103 (trade name)) manufactured by Okuno Chemical Industries Co., Ltd. at 65° C. for 5 min for swelling, thereafter dipping in a desmear treatment liquid (PTH1200 (trade name) and PTH1200NA (trade name)) manufactured by Okuno Chemical Industries Co., Ltd. at 80° C. for 8 min, and finally dipping in a neutralizing liquid for desmear treatment (PTH-B303 (trade name)) manufactured by Okuno Chemical Industries Co., Ltd. at 45° C. for 5 min.

Then, on the inner walls of the via holes, a plating layer having a thickness of 0.4 to 0.8 µm was formed by electroless plating, and thereafter, a plating layer of 15 to 30 µm was formed by cupric sulfate plating using copper sulfate (concentration: 60 to 80 g/L) and sulfuric acid (concentration: 150 to 200 g/L). Thereby, the third metal foil 14 and the second metal foil 12 (first circuit pattern layer), and the fourth metal foil 16 and the first metal foil 11 (second circuit pattern layer) were electrically connected through the plating portions of the respective via holes.

Thereafter, on each of both surfaces of the laminate having a patterned metal foil, a photosensitive dry film resist (RD-1225 (trade name) manufactured by Hitachi Chemical Co., Ltd.) was laminated. Thereafter, a third and fourth circuit patterns were formed on the surfaces of the laminate having a patterned metal foil by a subtractive method in which predetermined circuit patterns were exposed after the above-mentioned hole for positioning, and the resultants were subjected to developing treatment, further etching treatment and resist stripping, to thereby obtain a package substrate for loading semiconductor devices (substrate for loading semiconductor devices).

Comparative Example 1

Figure 2:
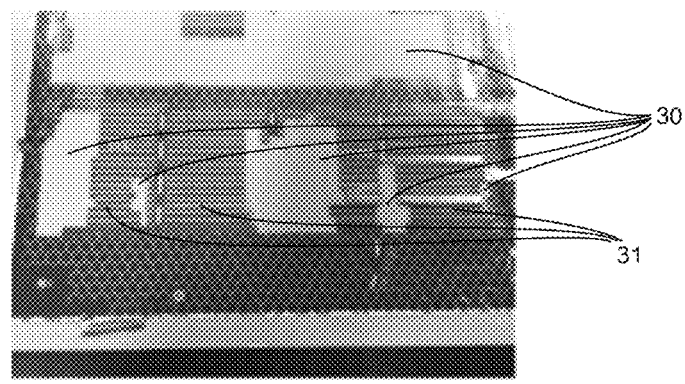
FIG. 2 shows a photograph of laminates obtained by a production method of Comparative Example 1.

On each of both surfaces of a laminate (C2006 (trade name) manufactured by 3M Co.) in which a copper foil, an insulating resin layer and a copper foil were laminated in this order, (wherein the composition of the insulating resin layer 10 contained an epoxy resin and barium titanate; the thickness of the insulating resin layer was 6 µm; the thickness of the copper foils was 3.5 µm), a photosensitive dry film resist (RD-1225 (trade name) manufactured by Hitachi Chemical Co., Ltd.) was laminated. Thereafter, when the laminated dry film resists on both the surfaces were exposed according to predetermined circuit patterns, and were subjected to developing treatment, and further, etching treatment, as shown in FIG. 2, the laminate ended in being damaged.

The present application is based on Japanese Patent Application (Japanese Patent Application No. 2017-220778), filed on Nov. 16, 2017, the content of which is incorporated herein by reference.

INDUSTRIAL APPLICABILITY

According to the present invention, since the laminate is not produced by using a support substrate, the amount of material wastes can be reduced. Further, since a step of producing the laminate containing a support substrate and a step of peeling and removing a support substrate can be eliminated, the present invention can be applied to existing production processes and is high in versatility. Further, according to the present invention, a thickness-reduced printed wiring board and a thickness-reduced substrate for loading semiconductor devices can suitably be obtained.

REFERENCE SIGNS LIST

10: FIRST INSULATING RESIN LAYER
11: FIRST METAL FOIL
12: SECOND METAL FOIL
13: SECOND INSULATING RESIN LAYER
14: THIRD METAL FOIL
15: THIRD INSULATING RESIN LAYER
16: FOURTH METAL FOIL
21: LAMINATE

22: LAMINATE HAVING PATTERNED METAL FOIL WHOSE SECOND METAL FOIL HAS BEEN PATTERNED
23: LAMINATE HAVING PATTERNED METAL FOIL ACCORDING TO FIRST EMBODIMENT
24: LAMINATE HAVING PATTERNED METAL FOIL WHOSE FIRST METAL FOIL AND SECOND METAL FOIL HAVE BEEN PATTERNED
25: LAMINATE HAVING PATTERNED METAL FOIL ACCORDING TO SECOND EMBODIMENT
30: DAMAGED PORTIONS (INDICATING DAMAGED PORTIONS OF INSULATING RESIN LAYER)
31: INSULATING RESIN LAYER (INDICATING PORTIONS NOT DAMAGED OF INSULATING RESIN LAYER)

The invention claimed is:

1. A method for producing a laminate having a patterned metal foil, comprising:
   masking a whole surface of a first metal foil in a laminate having the first metal foil, a first insulating resin layer having a thickness of 1 to 200 μm and a second metal foil laminated in this order;
   patterning the second metal foil;
   laminating a second insulating resin layer on the first insulating resin layer having the second metal foil laminated thereon so that the second metal foil in the laminate having the patterned metal foil is covered with the second insulating resin layer;
   laminating a third metal foil on the second insulating resin layer;
   masking a whole surface of the third metal foil in the laminate having the patterned metal foil; and
   patterning the first metal foil.

2. The method according to claim 1, wherein a thickness of the first metal foil is 1 to 100 μm.

3. The method according to claim 1, wherein the masking includes laminating a resist on the whole surface of the first metal foil for masking.

4. The method according to claim 1, wherein the masking includes laminating a resist on the whole surface of the third metal foil for masking.

5. A method for producing a laminate having a patterned metal foil, comprising:
   laminating a third insulating resin layer on the first insulating resin layer having the first metal foil laminated thereon so that the first metal foil in the laminate having the patterned metal foil according to claim 1 is covered with the third insulating resin layer; and
   laminating a fourth metal foil on the third insulating resin layer.

6. The method according to claim 1, further comprising irradiating a predetermined position of a surface of the third metal foil with a laser beam to thereby provide a first via hole starting from the surface of the third metal foil and reaching the second metal foil or the first metal foil on an opposite surface.

7. The method according to claim 6, further comprising subjecting an inside of the first via hole to a desmear treatment.

8. The method according to claim 5, further comprising irradiating a predetermined position of a surface of the third metal foil with a laser beam to thereby provide a second via hole starting from the surface of the third metal foil and reaching any of the second metal foil, the first metal foil or the fourth metal foil on an opposite surface.

9. The method according to claim 5, further comprising irradiating a predetermined position of a surface of the fourth metal foil with a laser beam to thereby provide a third via hole starting from the surface of the fourth metal foil and reaching any of the first metal foil, the second metal foil or the third metal foil on an opposite surface.

10. The method according to claim 8, further comprising subjecting an inside of the second via hole to a desmear treatment.

11. The method according to claim 9, further comprising subjecting an inside of the third via hole to a desmear treatment.

* * * * *